United States Patent
Jezewski et al.

(10) Patent No.: US 9,691,716 B2
(45) Date of Patent: Jun. 27, 2017

(54) TECHNIQUES FOR ENHANCING FRACTURE RESISTANCE OF INTERCONNECTS

(71) Applicant: INTEL CORPORATION, Santa Clara, CA (US)

(72) Inventors: Christopher J. Jezewski, Hillsboro, OR (US); Mauro J. Kobrinsky, Portland, OR (US); Daniel Pantuso, Portland, OR (US); Siddharth B. Bhingarde, Portland, OR (US); Michael P. O'Day, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/155,791

(22) Filed: May 16, 2016

(65) Prior Publication Data
US 2016/0268218 A1 Sep. 15, 2016

Related U.S. Application Data

(63) Continuation of application No. 13/753,245, filed on Jan. 29, 2013, now Pat. No. 9,343,411.

(51) Int. Cl.
*H01L 23/29* (2006.01)
*H01L 23/522* (2006.01)
(Continued)

(52) U.S. Cl.
CPC .......... *H01L 23/562* (2013.01); *H01L 23/481* (2013.01); *H01L 23/522* (2013.01);
(Continued)

(58) Field of Classification Search
CPC ......... H01L 2323/562; H01L 2323/481; H01L 2323/522; H01L 2323/5226;
(Continued)

(56) References Cited

U.S. PATENT DOCUMENTS 5,763,955 A  6/1998 Findley et al.
6,468,894 B1 10/2002 Yang et al.
(Continued)

FOREIGN PATENT DOCUMENTS

KR  10-2008-0025305 A  3/2008
KR  10-2010-0013977 A  2/2010
WO     2014120459 A1   8/2014

OTHER PUBLICATIONS

International Search Report and Written Opinion received for PCT Patent Application No. PCT/US2014/011858, mailed on May 20, 2014, 12 pages.
Office Action including Taiwan IPO Search Report received in Taiwan Patent Application No. 103100656, dated Feb. 15, 2016, 16 pages.
(Continued)

*Primary Examiner* — David Zarneke
(74) *Attorney, Agent, or Firm* — Finch & Maloney PLLC

(57) ABSTRACT

Techniques and structure are disclosed for enhancing fracture resistance of back-end interconnects and other such interconnect structures by increasing via density. Increased via density can be provided, for example, within the filler/dummified portion(s) of adjacent circuit layers within a die. In some cases, an electrically isolated (floating) filler line of an upper circuit layer may include a via which lands on a floating filler line of a lower circuit layer in a region corresponding to where the filler lines cross/intersect. In some such cases, the floating filler line of the upper circuit layer may be formed as a dual-damascene structure including such a via. In some embodiments, a via similarly may be provided between a floating filler line of the upper circuit layer and a sufficiently electrically isolated interconnect line of the lower circuit layer. The techniques/structure can be used to provide mechanical integrity for the die.

20 Claims, 5 Drawing Sheets

(51) Int. Cl.
*H01L 23/48* (2006.01)
*H01L 23/528* (2006.01)
*H01L 23/532* (2006.01)
*H01L 23/535* (2006.01)
*H01L 23/538* (2006.01)
*H01L 23/00* (2006.01)

(52) U.S. Cl.
CPC ........ *H01L 23/528* (2013.01); *H01L 23/5226* (2013.01); *H01L 23/5329* (2013.01); *H01L 23/293* (2013.01); *H01L 23/5221* (2013.01); *H01L 23/535* (2013.01); *H01L 23/5381* (2013.01); *H01L 23/5386* (2013.01); *H01L 2924/0002* (2013.01)

(58) Field of Classification Search
CPC ....... H01L 2323/528; H01L 2323/5329; H01L 2323/293; H01L 2323/5221; H01L 2323/535; H01L 2323/5381; H01L 2323/5386; H01L 2323/76837
See application file for complete search history.

(56) References Cited

U.S. PATENT DOCUMENTS

| | | | |
|---|---|---|---|
| 7,015,582 | B2 | 3/2006 | Landis |
| 7,274,074 | B2 | 9/2007 | Koubuchi et al. |
| 7,605,085 | B2 | 10/2009 | Tomita et al. |
| 9,343,411 | B2 * | 5/2016 | Jezewski ............... H01L 23/562 |
| 2002/0096777 | A1 | 7/2002 | Chow et al. |
| 2003/0116852 | A1 | 6/2003 | Watanabe et al. |
| 2005/0035457 | A1 | 2/2005 | Tomita et al. |
| 2006/0011993 | A1 | 1/2006 | Kang et al. |
| 2006/0166434 | A1 | 7/2006 | Kinoshita et al. |
| 2007/0120260 | A1 | 5/2007 | Kitabayashi et al. |
| 2008/0067690 | A1 | 3/2008 | Kumagai |
| 2011/0156219 | A1 | 6/2011 | Kawashima et al. |
| 2014/0043902 | A1 | 2/2014 | Unno |
| 2014/0210098 | A1 | 7/2014 | Jezewski et al. |
| 2015/0131382 | A1 | 5/2015 | Himeno |

OTHER PUBLICATIONS

Wang et al., "Packaging Effects on Reliability of Cu/Low-k Interconnects", IEEE Transactions on Device and Materials Reliability, vol. 3, Issue No. 4, Dec. 2003, pp. 119-128.

* cited by examiner

TECHNIQUES FOR ENHANCING FRACTURE RESISTANCE OF INTERCONNECTS

RELATED APPLICATION

This application is a continuation of U.S. patent application Ser. No. 13/753,245 filed Jan. 29, 2013 (now U.S. Pat. No. 9,343,411), which is herein incorporated by reference in its entirety.

BACKGROUND

Integrated circuit (IC) design in the deep-submicron process nodes (e.g., 32 nm and beyond) involves a number of non-trivial challenges, and IC packaging has faced particular complications, such as those with respect to flip-chip packages. Continued package scaling will tend to exacerbate such problems.

BRIEF DESCRIPTION OF THE DRAWINGS

FIG. 2' is a side cross-section view of an IC configured in accordance with another embodiment of the present invention.

FIG. 2" is a side cross-section view of an IC configured in accordance with another embodiment of the present invention.

Figure 1A:
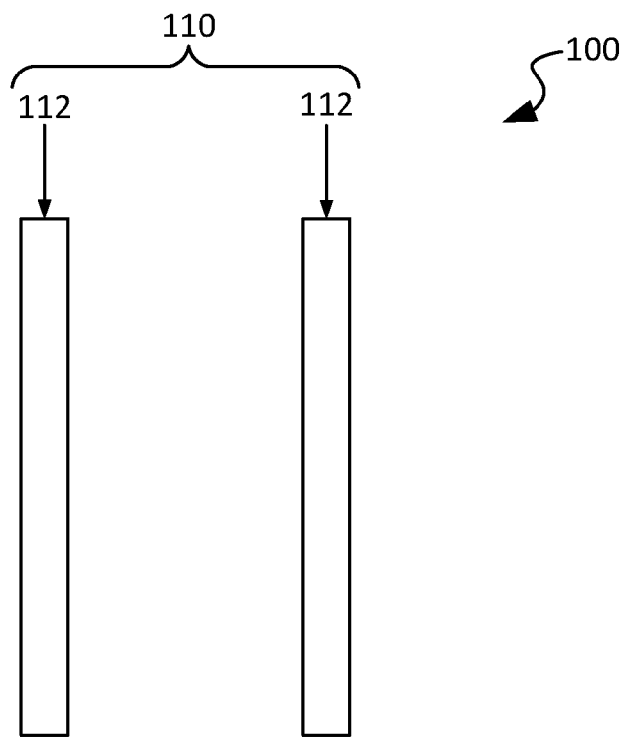
FIGS. 1A-1D demonstrate an example process flow and a top-down view of an example integrated circuit (IC), in accordance with an embodiment of the present invention.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the claimed invention to the specific configurations shown. For instance, while some figures generally indicate straight lines, right angles, and smooth surfaces, an actual implementation of the disclosed techniques/structure may have less than perfect straight lines, right angles, etc., and some features may have surface topology or otherwise be non-smooth, given real world limitations of IC fabrication/processing. In short, the figures are provided merely to show example structures.

DETAILED DESCRIPTION

Techniques and structure are disclosed for enhancing fracture resistance of back-end interconnects and other such interconnect structures by increasing via density. Increased via density can be provided, for example, within the filler/dummified portion(s) of adjacent circuit layers within a die (e.g., chip, microprocessor, etc.). In some cases, an electrically isolated (floating) filler line of an upper circuit layer may include a via which lands on a floating filler line of a lower circuit layer in a region corresponding to where the filler lines cross/intersect. In some such cases, the floating filler line of the upper circuit layer may be formed as a dual-damascene structure including such a via. In some embodiments, a via similarly may be provided between a floating filler line of the upper circuit layer and a sufficiently electrically isolated interconnect line of the lower circuit layer. In some cases, the disclosed techniques/structure can be used to physically anchor/couple adjacent circuit layers and, in some such instances, provide improved fracture resistance and mechanical integrity for the interconnect. The techniques may be particularly useful, for example, in low-κ interconnect structures, which generally may possess weaker mechanical properties than interconnect structures made with dielectric materials having higher dielectric constants. Numerous configurations and variations will be apparent in light of this disclosure.

General Overview

As previously indicated, there are a number of non-trivial issues that can arise which complicate integrated circuit (IC) packaging. For instance, one non-trivial issue pertains to the fact that interaction between a given chip and its packaging is a significant reliability issue, for example, for copper (Cu)/low-κ chips during assembly into a plastic flip-chip package. With use of low-κ dielectric materials for interlayer dielectric (ILD), packaging-induced interfacial delamination in such low-κ interconnects becomes more prevalent, raising reliability concerns for chips. In a flip-chip package, for instance, the thermal mismatch between die and substrate can result in large stresses in the Cu/low-κ interconnect structure, potentially leading to interfacial cracking.

Thus, structural integrity may be a significant reliability concern, for example, for high-density flip-chip packages due to large deformation and stresses generated by thermal mismatch between the silicon (Si) die and the substrate. In some cases, an underfill can be utilized in an attempt to reduce thermal stresses at the solder bumps and to improve package reliability. However, in most packaging process flows, the IC die may experience significant stresses during the packaging process before the underfill is applied. Furthermore, even after the underfill is applied, stresses may be sufficiently high to cause failures in the IC.

Also, these fracture issues can be exacerbated by various portions of assembly processing. For example, various solder reflow processes can induce large shear stresses that get transmitted down into the die, causing fracture within the low-κ layers, for instance. Large stresses that can cause ILD cracking are generally located at the edge and corners of the die.

Thus, and in accordance with an embodiment of the present invention, techniques and structure are disclosed for enhancing fracture resistance of interconnects by increasing via density. Increased via density can be provided, for example, within the floating filler portion(s) of adjacent/neighboring circuit layers (e.g., metal layers) within a die. In some embodiments, a floating filler line of an upper circuit layer may include a via (or similar structure) which is made to land on a floating filler line of a lower circuit layer in a region where those filler lines cross/intersect. In some such cases, and in accordance with an embodiment, the floating filler line of the upper circuit layer may be formed as a dual-damascene structure including such a via. It should be noted, however, that the claimed invention is not so limited. For instance, in some embodiments, a via similarly may be provided between a floating filler line of the upper circuit layer and a sufficiently electrically isolated interconnect line of the lower circuit layer. Numerous configurations will be apparent in light of this disclosure, including the following background information.

In the context of IC design, a functional unit block (FUB, or functional block, or IP block) generally refers to a discrete section of a chip design that accomplishes a desired function. In any given IC design process, a number of FUBs may be made, which in turn may allow for parallel sections of a chip to be designed simultaneously. In some embodiments, dummy metal lines (known as filler lines) may be added to a completed FUB layout, for example, to satisfy design rules that were put in place due to pattern and process fidelity, for instance, of chemical mechanical planarization/polishing (CMP) processes, lithographic patterning processes, etc. As will be appreciated in light of this disclosure, the filler density can vary from one case to the next and will depend on factors such as the product and layer to which it is added. As will be appreciated in light of this disclosure, there may exist within a given die a very significant cross-sectional area available, for example, for providing structure which may aid in reinforcing a given die against fracture or other mechanical failure.

In some instances, and in accordance with an embodiment, use of the disclosed techniques/structure to enhance fracture resistance with increased via density (including vias within filler sections) may provide physical anchoring/coupling between neighboring or otherwise adjacent circuit layers, which in turn may improve the mechanical resilience of a given circuit (e.g., minimize or otherwise reduce susceptibility to fracture). In some cases, the disclosed techniques/structure may be used between metal layers, for example, including ILD structures (e.g., low-κ dielectric structures, silicon dioxide dielectric structures, or high-κ dielectric structures). In some instances, a via density which is greater than the minimum design rules may be provided, in accordance with an embodiment.

As will be appreciated in light of this disclosure, the disclosed techniques/structure can be used, in some instances, in any given IC packaging where it may be desirable, for example, to strengthen a given die against fracturing/mechanical failure. For example, some embodiments may be implemented in flip-chip packaging. However, and as will be appreciated in light of this disclosure, the techniques provided herein are not so limited, as some other embodiments can be used to mitigate other sources of stress on a given IC. For instance, wafer or die bonding (e.g., where two wafers or die are bonded together) can cause stresses that can result in mechanical integrity failures which can be prevented or otherwise reduced using the disclosed techniques. Likewise, wire bonding to electrically connect a given package and IC also applies stresses in the die (e.g., wire bonding is an alternative to flip-chip bonding) that can be prevented or otherwise reduced using the disclosed techniques. In this sense, the techniques can be applied to ICs where wafer-wafer, die-wafer, and/or die-die bonding is employed and/or to ICs which are associated with flip-chip packaging, wire bond packaging, three-dimensional die bonding, multi-die bonding, and/or through-silicon vias (TSVs). Some embodiments can be utilized, for instance, with multi-layer dies implemented with porous dielectric materials, low-κ dielectric materials, and/or ultra-low-κ dielectric materials, or other such materials that may be associated with poor mechanical integrity. The disclosed techniques can be used, for example, in semiconductor manufacturing processes at any given process node (e.g., 32 nm and beyond; 22 nm and beyond; 14 nm and beyond; etc.).

The use of the disclosed techniques/structure may be detected, for example, by cross-sectional analysis of a given IC or other device which has vias in the electrically floating region of the filler lines thereof, in accordance with some embodiments. Other suitable techniques/approaches for detecting use of the disclosed techniques/structure will depend on a given application and will be apparent in light of this disclosure.

Techniques and Structure

Figure 2:
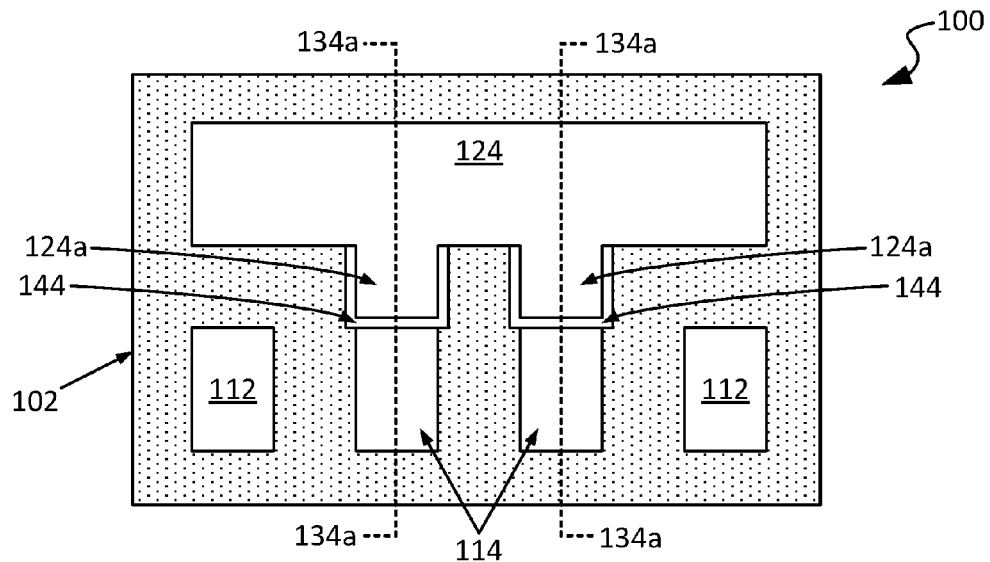
FIG. 2 is a side cross-section view of the resulting IC of FIG. 1D taken along dashed line X-X therein.
Figure 2:
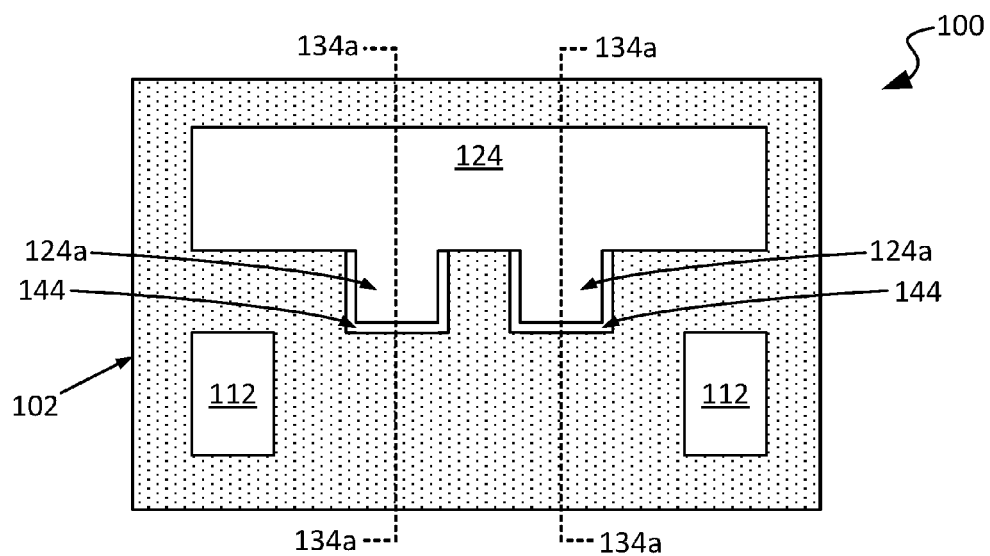
Figure 2:
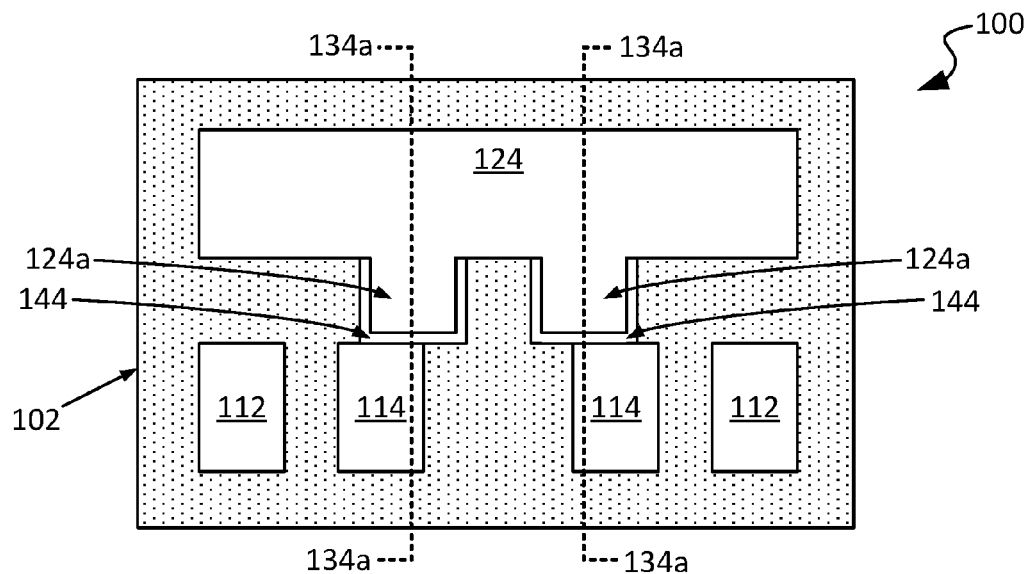
Figure 3:
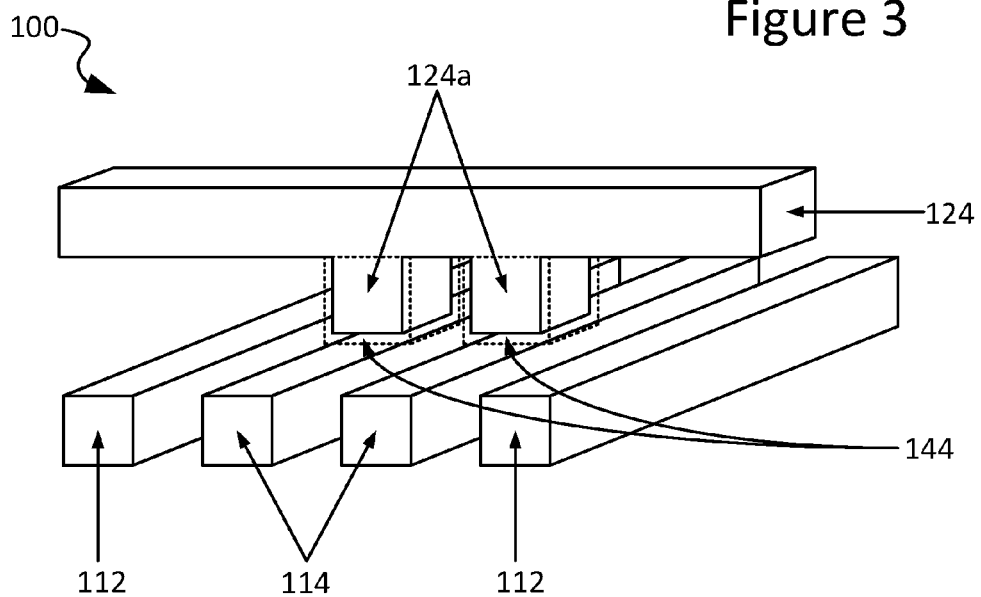
FIG. 3 is a side perspective view of an IC configured in accordance with an embodiment of the present invention.

FIGS. 1A-1D demonstrate an example process flow and a top-down view of an example integrated circuit (IC) 100, in accordance with an embodiment of the present invention. FIG. 2 is a side cross-section view of the resulting IC 100 of FIG. 1D taken along dashed line X-X therein. FIG. 3 is a side perspective view of an IC 100 configured in accordance with an embodiment of the present invention. With respect to the process flow, standard semiconductor processing techniques can be used (e.g., deposition, mask, etch, etc.), as will be appreciated in light of this disclosure.

Figure 1B:
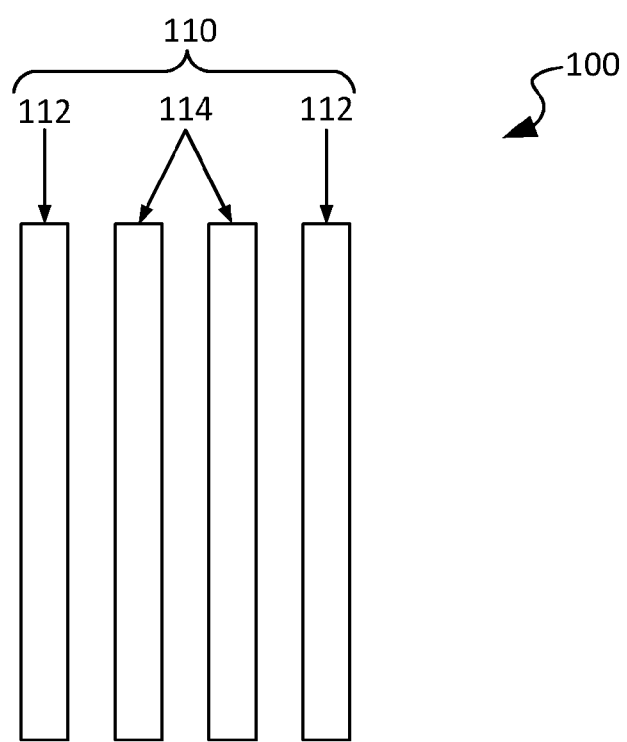
Figure 1C:
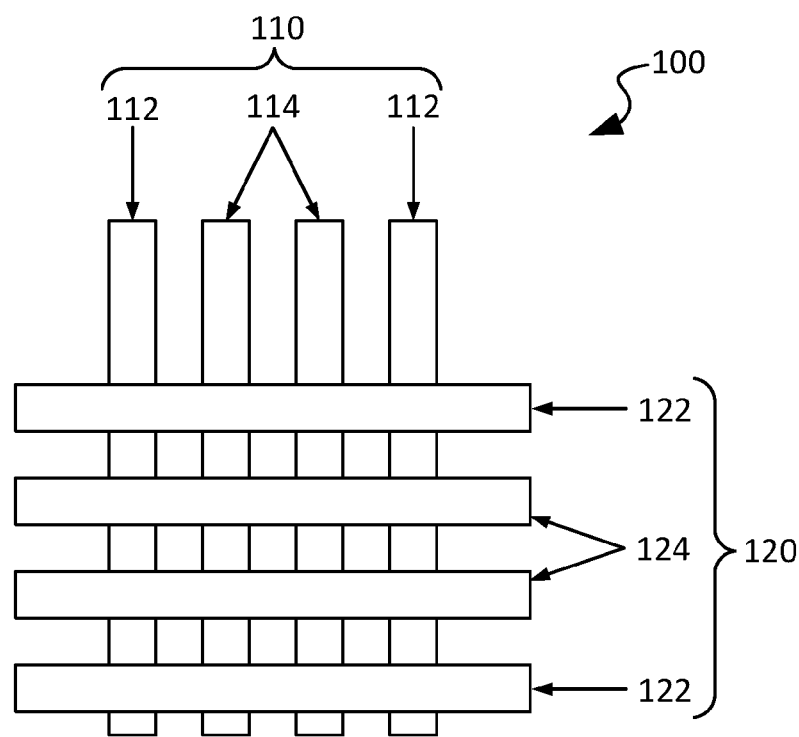
Figure 1D:
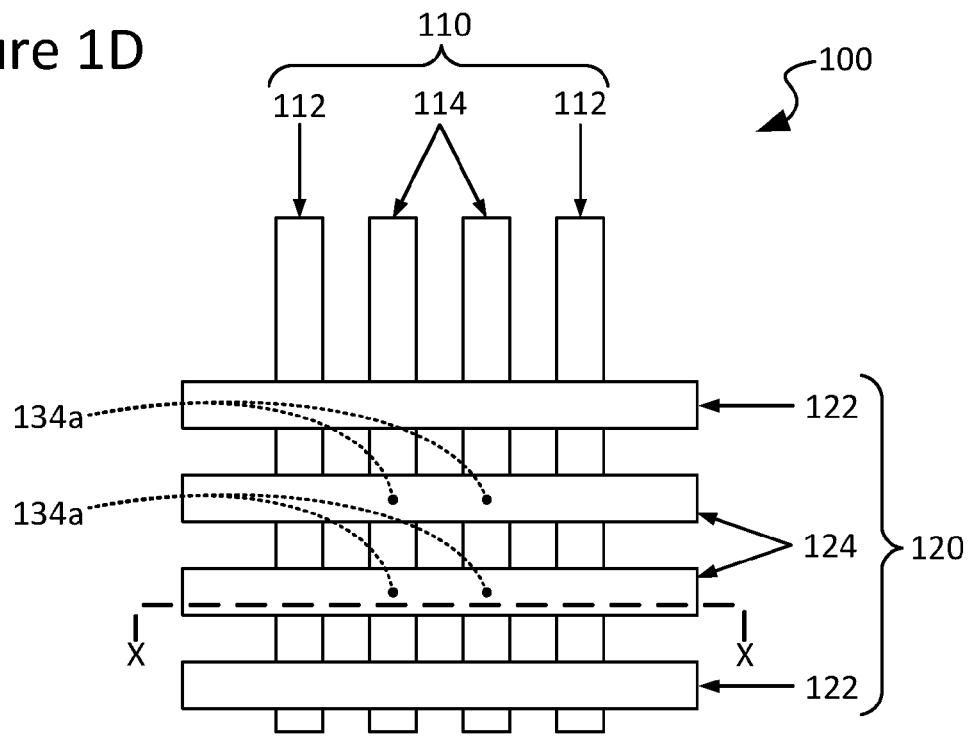

FIG. 1A shows an example circuit layer 110 (e.g., a metal layer X) which is configured with conductive interconnect lines 112. FIG. 1B shows a number of filler lines 114 that have been added to circuit layer 110, for example, to satisfy line density design rules. While the filler interconnect lines 114 are depicted here, for example, as long lines (e.g., length significantly larger than the width), such lines also may be broken into short segments (e.g., such that length is comparable to width). Also, while the interconnect lines 112/114 shown in this example run in one direction only, there may be cases in which they have, for instance, an L-shape, a short segment, or a shape where one portion of the line has a width that is larger than the rest of the line (e.g., a wider landing area for a via). Numerous configurations will be apparent in light of this disclosure. FIG. 1C shows an example circuit layer 120 (e.g., a metal layer X+1) provided over circuit layer 110. Circuit layer 120 includes interconnect lines 122 and a number of filler lines 124 (e.g., added to circuit layer 120, for example, to satisfy line density design rules), which are substantially orthogonal to interconnect lines 112 and filler lines 114 of underlying circuit layer 110. FIG. 1D shows the intersection area of the circuit layer 110 (e.g., metal layer X) and the circuit layer 120 (e.g., metal layer X+1) where there exists opportunity to put vias that will serves as anchors which increase the mechanical fracture resistance of the resulting IC 100, as will now be discussed in more detail.

As can be seen with particular reference to FIG. 2, circuit layers 110/120 can be formed, in some embodiments, within an insulator material (e.g., an inter-layer dielectric or ILD) 102. As will be appreciated in light of this disclosure, IC 100 may include additional, fewer, and/or different elements or components from those here described, and the claimed invention is not intended to be limited to any particular IC configurations, but can be used with numerous configurations in numerous applications.

In accordance with some embodiments, first circuit layer 110 may include: (1) one or more interconnect lines 112; and/or (2) one or more filler lines 114. In some cases, a given quantity of filler lines 114 may be disposed between a given pair of neighboring or otherwise adjacent interconnect lines 112, as variously shown in FIGS. 1B-1D and 2. In accordance with an embodiment, a given interconnect line 112 or filler line 114 may comprise any of a wide range of electrically conductive metals/materials. Some example materials suitable for interconnect/filler lines may include, but are not necessarily limited to: copper (Cu); aluminum (Al); silver (Ag); nickel (Ni); gold (Au); titanium (Ti); tungsten (W);

ruthenium (Ru); cobalt (Co); chromium (Cr); iron (Fe); manganese (Mn); hafnium (Hf); tantalum (Ta); vanadium (V); molybdenum (Mo); palladium (Pd); platinum (Pt); and/or an alloy or combination of any of the aforementioned. Further note that the interconnect/filler materials may be metallic or non-metallic and may include polymeric materials. To this end, any material having a suitable degree of conductivity or that can otherwise enhance the structural quality of the device as described herein can be used for the interconnect and/or filler lines. Other suitable materials for a given interconnect/filler line will depend on a given application and will be apparent in light of this disclosure.

In some cases, adjacent or otherwise neighboring interconnect lines 112 of first circuit layer 110 may be substantially parallel with one another (e.g., precisely parallel or otherwise within a given tolerance). In some embodiments, adjacent or otherwise neighboring filler lines 114 of first circuit layer 110 may be substantially parallel with one another and/or with the surrounding interconnect lines 112 (e.g., precisely parallel or otherwise within a given tolerance). In some embodiments, some or all of the filler lines 114 of first circuit layer 110 may be: (1) electrically connected, for instance, to be used for power optimization (e.g., voltage drop and/or heat-sinking); and/or (2) left electrically floating. Other suitable configurations for first circuit layer 110 will depend on a given application and will be apparent in light of this disclosure.

As previously noted, IC 100 also includes second circuit layer 120 disposed proximate (e.g., above or otherwise adjacent to) first circuit layer 110, in accordance with an embodiment. Second circuit layer 120 may include, in accordance with some embodiments: (1) one or more interconnect lines 122; and/or (2) one or more filler lines 124. In some embodiments, a given quantity of filler lines 124 may be disposed between a given pair of neighboring or otherwise adjacent interconnect lines 122, as shown in FIGS. 1C-1D.

As will be appreciated in light of this disclosure, and in accordance with some embodiments, a given interconnect line 122 and filler line 124 may comprise, for example, any of the electrically conductive metals/materials discussed above with reference to lines 112/114 of first circuit layer 110. The relevant previous discussion is equally applicable here.

In some cases, adjacent or otherwise neighboring interconnect lines 122 of second circuit layer 120 may be substantially parallel with one another (e.g., precisely parallel or otherwise within a given tolerance). In some cases, adjacent or otherwise neighboring filler lines 124 of second circuit layer 120 may be substantially parallel with one another and/or with the surrounding interconnect lines 122 (e.g., precisely parallel or otherwise within a given tolerance). In some embodiments, some or all of the filler lines 124 of second circuit layer 120 may be: (1) electrically connected, for instance, to be used for power optimization (e.g., voltage drop and/or heat-sinking); and/or (2) left electrically floating. Other suitable configurations for second circuit layer 120 will depend on a given application and will be apparent in light of this disclosure.

As will be appreciated in light of this disclosure, the disclosed techniques may be compatible with any of a wide variety of interconnect and/or filler line contexts and structures. Some example such structures may include, but are not necessarily limited to: single-damascene structures; dual-damascene structures (e.g., a line with an underlying via); anisotropic structures; isotropic structures; and/or any other desired IC structures, interconnects, or other conductive structures. Also, in accordance with an embodiment, the dimensions of a given interconnect or filler line may be customized as desired for a given target application or end-use. Other suitable interconnect/filler configurations will depend on a given application and will be apparent in light of this disclosure.

In some cases, for example, second circuit layer 120 may be oriented at a given angle relative to first layer 110. For instance, as shown in FIG. 1D, second circuit layer 120 may be substantially orthogonal to first circuit layer 110 (e.g., at a 90° offset or otherwise within a given tolerance range thereof), in some embodiments. However, the claimed invention is not so limited, as in some other embodiments, second circuit layer 120 may be offset at lesser and/or greater angles (e.g., diagonal, etc.). Further note that the first circuit layer 110 and the second circuit layer 120 may be planar or non-planar, and may be fully or partially interfaced with one another. For instance, in one example embodiment, each of circuits 110 and 120 may be flexible or otherwise curved/bent away from one another such that only the central portions of circuits 110 and 120 are sufficiently proximate to produce intersecting filler lines that can be used for increasing via density. In this sense, circuit layers 110 and 120 need not be flat or otherwise planar.

In any case, by virtue of how second circuit layer 120 is oriented relative to first circuit layer 110, a given filler line 124 may be made to intersect (e.g., cross over or otherwise overlap) a given filler line 114, for example, at a location generally denoted in FIGS. 1D and 2 by an intersection 134a. For instance, in the example embodiment depicted in FIG. 1D, four intersection locations 134a are provided by virtue of how the two filler lines 124 of second circuit layer 120 cross over the two filler lines 114 of first circuit layer 110. As will be appreciated in light of this disclosure, a greater or lesser number of intersecting locations may be provided as desired for a given IC 100 and may depend, at least in part, on the configuration of a given first circuit layer 110 and/or second circuit layer 120. Numerous configurations will be apparent in light of this disclosure.

As previously noted, and in accordance with an embodiment, the region/volume located between second circuit layer 120 and first circuit layer 110 and corresponding to where a given filler line 124 overlaps another filler line 114 (e.g., generally denoted by a given intersection 134a) provides an opportunity to include structure which aids in improving the mechanical resilience (e.g., fracture resistance, etc.) of IC 100. To that end, and in accordance with an embodiment, a given filler line 124 may be configured, for example, as a dual-damascene structure having one or more vias 124a extending therefrom and made to land at a given filler line 114, as shown in the example case of FIG. 2. Such a via 124a may serve, in accordance with an embodiment, to physically couple a given filler line 124 and a given filler line 114, thus serving to physically anchor/couple together circuit layers 110 and 120. Furthermore, in some embodiments, if a given interconnect line 112 is sufficiently electrically isolated, then a given filler line 124 which intersects/crosses over such interconnect line 112 may include a via 124a which lands on that interconnect line 112, for example, to aid in physically anchoring/coupling second circuit layer 120 and first circuit layer 110. Whether filler lines are floating or not and whether an interconnect line can be coupled to a filler line will depend on factors such as the given application and whether or not such coupling will adversely impact the electrical reliability or performance of the given circuit. As will be appreciated in light of this disclosure, and in accordance with an embodiment, it may be desirable to ensure that any vias 124a provided as described herein adhere to applicable design rules and/or circuit performance criteria. Numerous configurations will be apparent in light of this disclosure.

For example, as can be seen from FIG. 2', which is a side cross-section view of an IC 100 configured in accordance with another embodiment of the present invention, in some cases hanging vias 124a (e.g., filler lines 114 are not present) may be provided. Furthermore, as can be seen from FIG. 2", which is a side cross-section view of an IC 100 configured in accordance with another embodiment of the present invention, in some cases un-landed vias 124a (e.g., partially landed or otherwise not fully landed) may be provided. Other suitable configurations will depend on a given application and will be apparent in light of this disclosure.

As can be seen from FIG. 3, for example, a given via 124a may have a substantially box-like geometry. However, other geometries for a given via 124a may be provided, in accordance with an embodiment, and may depend, at least in part, on: (1) the profile/geometry of a given filler line 124 and/or a given filler line 114; and/or (2) the orientation of second circuit layer 120 relative to first circuit layer 110. Furthermore, as will be appreciated in light of this disclosure, and in accordance with an embodiment, the dimensions of a given via 124a may be customized for a given target application or end use and may depend, at least in part, on: (1) the dimensions of a given filler line 124 and/or a given filler line 114; and/or (2) the distance between second layer 120 and first circuit layer 110. In short, a given via 124a may have any of a wide variety of configurations, as will be apparent in light of this disclosure.

In some embodiments, an optional barrier and/or adhesion layer 144 may be included between a given via 124a and the filler line 114 on which it lands. As will be appreciated in light of this disclosure, and in accordance with one such embodiment, layer 144 may be provided, for example, during the formation of IC 100 using any of a wide range of deposition techniques/processes, such as, but not necessarily limited to: (1) chemical vapor deposition (CVD); (2) physical vapor deposition (PVD) (e.g., sputtering); (3) spin coating/spin-on deposition (SOD); (4) electron beam evaporation; and/or (5) a combination of any of the aforementioned. As will be further appreciated in light of this disclosure, and in accordance with an embodiment, barrier and/or adhesion layer 144 may be provided with any given thickness, as desired for a given target application or end-use. However, as previously noted, layer 144 may be optional in some cases and thus may be omitted (e.g., such as is generally represented by the dotted-line boxes, for example, in FIG. 3). Other suitable deposition processes/techniques and/or configurations for barrier layer 144 will depend on a given application and will be apparent in light of this disclosure.

In accordance with an embodiment, optional barrier and/or adhesion layer 144 may comprise any of a wide range of materials. In some embodiments, layer 144 is conductive and remains at the via interface. Some example suitable conductive materials include titanium (Ti), titanium nitride (TiN), tantalum (Ta), tantalum nitride (TaN), and ruthenium (Ru), to name a few. Numerous other suitable conductive barrier and/or adhesion materials will be apparent. In some other embodiments, layer 144 can be non-conductive if it is removed from the bottom of the vias. Some example suitable non-conductive materials include silicon nitride ($Si_3N_4$), silicon dioxide ($SiO_2$), silicon oxynitride ($SiO_xN_y$), titanium nitride (TiN), and silicon carbon nitride (SiCN). In some cases, the material(s) utilized for a given barrier and/or adhesion layer 144 may depend, at least in part, on the material(s) implemented in filler line 114, filler line 124, and/or ILD 102. Other suitable conductive and/or non-conductive materials for optional barrier and/or adhesion layer 144 will be apparent in light of this disclosure.

As previously noted, and as can be seen with particular reference to FIG. 2, first layer 110 and second layer 120 can be formed, in part or in whole, within an insulator material (e.g., an inter-layer dielectric or ILD) 102 in some cases. In accordance with an embodiment, the disclosed techniques can be implemented with any of a wide variety of ILD 102 insulator materials (e.g., low-κ, high-κ, or otherwise). For instance, in some example embodiments, the disclosed techniques can be used with an ILD 102 comprising one or more of: (1) an oxide, such as silicon dioxide ($SiO_2$), silicon oxide (SiO), carbon-doped $SiO_2$, etc.; (2) a nitride, such as silicon nitride ($Si_3N_4$), etc.; (3) polytetrafluoroethylene (PTFE); (4) a phosphosilicate glass (PSG); (5) a fluorosilicate glass (FSG); (6) an organosilicate glass (OSG), such as silsesquioxane, siloxane, etc.; and/or (7) a combination of any of the aforementioned. In some embodiments, ILD 102 may comprise a material having a dielectric constant, for example, that is less than the dielectric constant of silicon dioxide ($SiO_2$). In some embodiments, ILD 102 may be substantially non-porous, whereas in some other embodiments, ILD 102 may be provided with any degree of porosity, as desired for a given target application or end-use. Other suitable dielectric materials for ILD 102 will depend on a given application and will be apparent in light of this disclosure.

In some cases, ILD 102 may be deposited, as desired, on a substrate, wafer, or other suitable surface. As will be appreciated in light of this disclosure, any of a wide range of suitable deposition techniques may be utilized, such as, but not limited to: (1) physical vapor deposition (PVD); (2) chemical vapor deposition (CVD); and/or (3) spin coating/spin-on deposition (SOD). As will be further appreciated in light of this disclosure, ILD 102 may be provided with any given thickness, as desired for a given target application or end-use. Other suitable configurations, deposition techniques, and/or thicknesses for ILD 102 will depend on a given application and will be apparent in light of this disclosure.

In some cases, one or more portions of IC 100 may undergo a chemical-mechanical planarization (CMP) process or any other suitable polishing/planarization technique/process, as will be apparent in light of this disclosure. Planarization of IC 100 may be performed, for instance, to remove any undesired excess of: (1) a given interconnect line 112; (2) a given filler line 114; (3) a given interconnect line 122; (4) a given filler line 124; (5) a barrier layer 144, when optionally included; and/or (6) ILD 102. In some instances, IC 100 may be, for example, a partially processed IC with one or more devices and/or metal layers. In some cases, IC 100 may be included in a silicon (Si) die, wafer, or other semiconductive structure. Numerous suitable configurations will be apparent in light of this disclosure.

Example System

Figure 4:
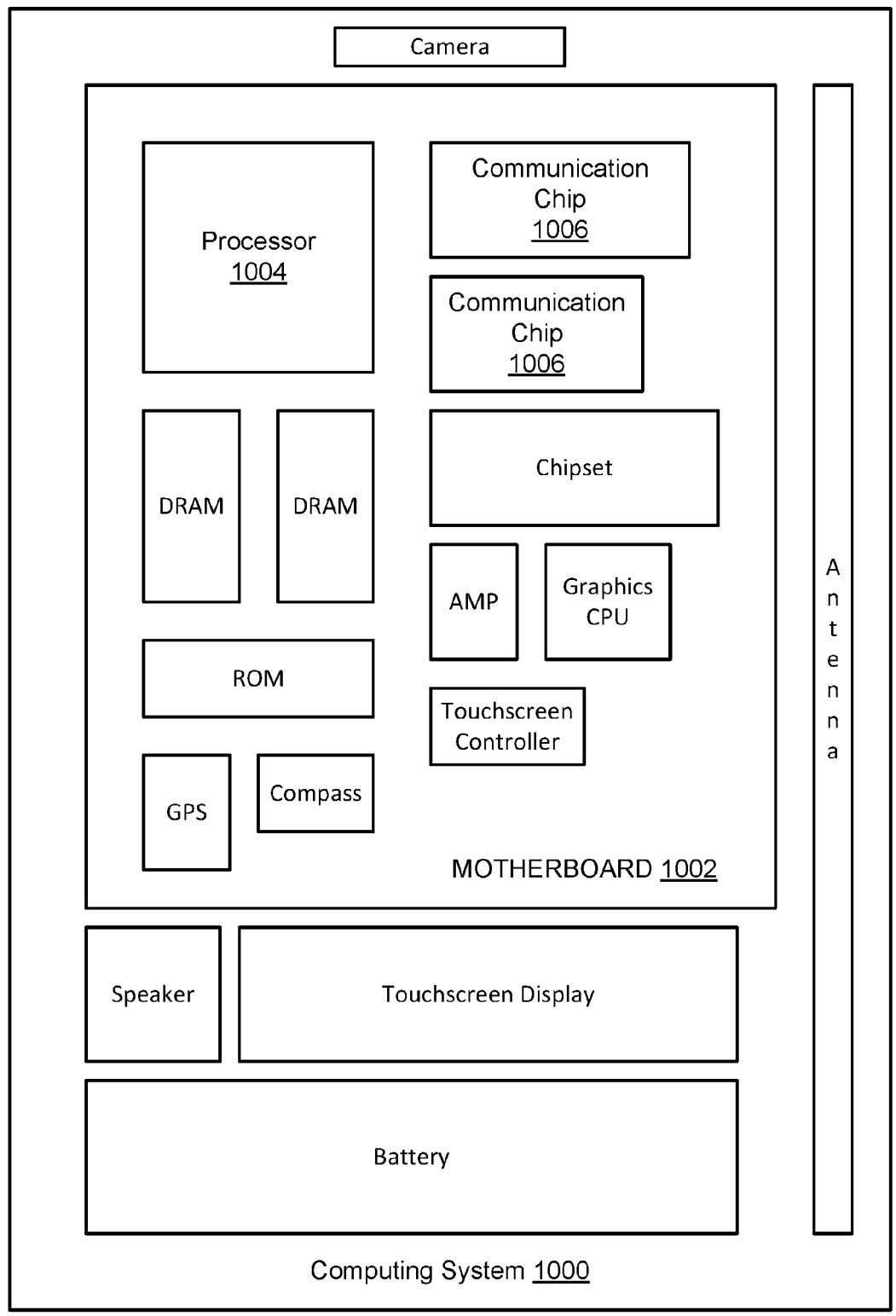
FIG. 4 illustrates a computing system implemented with IC structures or devices formed using the disclosed techniques, in accordance with an example embodiment of the present invention.

FIG. 4 illustrates a computing system 1000 implemented with integrated circuit (IC) structures or devices formed using the disclosed techniques, in accordance with an example embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques, in accordance with an example embodiment of the present invention. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), EvDO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Numerous embodiments will be apparent in light of this disclosure. One example embodiment of the present invention provides an integrated circuit including a first circuit layer including a first filler line and a second circuit layer adjacent to the first circuit layer, the second circuit layer including a second filler line, wherein the second filler line includes a first anchoring structure which anchors the second filler line to the first filler line. In some cases, at least one of the first filler line and/or the second filler line is electrically floating. In some instances, the first anchoring structure comprises a via extending from the second filler line and landing on the first filler line at a location where the second filler line crosses over the first filler line. In some cases, the second filler line and anchoring structure comprise a dual-damascene structure. In some instances, the first anchoring structure at least one of physically anchors the first and second circuit layers and/or improves fracture resistance of the integrated circuit. In some cases, the integrated circuit further includes a barrier layer between the first anchoring structure and the first filler line. In some instances, the first circuit layer further includes a first interconnect line that is electrically isolated from the first filler line. In some cases, the second filler line further includes a second anchoring structure which anchors the second filler line to a first interconnect line of the first circuit layer. In some such cases, the second anchoring structure comprises a via extending from the second filler line and landing on the first interconnect line at a location where the second filler line crosses over the first interconnect line. In some cases, the integrated circuit further includes at least one of an un-landed via and/or a hanging via. In some instances, each of the first and second circuit layers further includes a dielectric material in which the first and second filler lines are formed. In some such instances, the dielectric material comprises a low-κ dielectric material having a dielectric constant that is less than the dielectric constant of silicon dioxide (SiO$_2$). In some cases, the integrated circuit further includes a through-silicon via (TSV). In some instances, the integrated circuit further includes a three-dimensional configuration of two or more dies bonded together. In some cases, the integrated circuit further includes a multi-chip configuration of two or more dies within a common package. In some cases, a wire-bonded package including the integrated circuit is provided. In some cases, a flip-chip package including the integrated circuit is provided. In some cases, a mobile computing device including the integrated circuit is provided.

Another example embodiment of the present invention provides an integrated circuit including a dielectric layer, a first circuit layer formed within the dielectric layer, the first circuit layer including a first plurality of filler lines including a first filler line, and a second circuit layer formed within the dielectric layer and adjacent to the first circuit layer, the second circuit layer including a second plurality of filler lines including a second filler line, wherein the second filler line includes a via extending therefrom and landing on the first filler line at a location at which the second filler line crosses over the first filler line. In some instances, the integrated circuit further includes a plurality of additional dielectric layers, each having first and second circuit layers therein. In some cases, the integrated circuit is included in a silicon die, and the dielectric layer comprises a low-κ dielectric material having a dielectric constant that is less than the dielectric constant of silicon dioxide ($SiO_2$). In some instances, the dielectric layer comprises at least one of an oxide, a nitride, a polymer, a phosphosilicate glass (PSG), an organosilicate glass (OSG), and/or a combination of any of the aforementioned. In some cases, the integrated circuit further includes a barrier layer disposed between the via and the first filler line. In some such cases, the barrier layer comprises a conductive material.

Another example embodiment of the present invention provides an integrated circuit including a first circuit layer including a first plurality of electrically isolated filler lines formed in a low-κ dielectric material having a dielectric constant that is less than the dielectric constant of silicon dioxide ($SiO_2$), and a second circuit layer formed on the first circuit layer, the second circuit layer including a second plurality of electrically isolated filler lines formed in a low-κ dielectric material having a dielectric constant that is less than the dielectric constant of silicon dioxide ($SiO_2$), wherein at least one filler line of the second plurality of filler lines is configured as a dual-damascene structure including a via extending therefrom and landing on a filler line of the first plurality of filler lines. In some cases, the first circuit layer further includes a first interconnect line, and at least one filler line of the second plurality of filler lines includes a via extending therefrom and landing on the first interconnect line. In some such cases, the via landing on the first filler line and the via landing on the first interconnect line extend from the same filler line of the second plurality of filler lines.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An integrated circuit comprising:
a first circuit layer including a first feature; and
a second circuit layer adjacent to the first circuit layer, the second circuit layer including a first filler line, wherein the first filler line includes a first anchoring structure which anchors the first filler line to the first feature; wherein the first filler line is electrically floating.

2. The integrated circuit of claim 1, wherein the first anchoring structure comprises a via extending from the first filler line to the first feature.

3. The integrated circuit of claim 1, wherein the first filler line and first anchoring structure comprise a dual-damascene structure.

4. The integrated circuit of claim 1, further comprising a barrier layer between the first anchoring structure and the first filler line.

5. The integrated circuit of claim 1, wherein the first circuit layer further includes an interconnect structure that is electrically isolated from the first filler line.

6. The integrated circuit of claim 1, further comprising a second anchoring structure which anchors the first feature to a first interconnect line of the first circuit layer.

7. The integrated circuit of claim 6, wherein the second anchoring structure comprises a via extending from the first feature to the first interconnect line.

8. The integrated circuit of claim 1, wherein the anchoring structure comprises an un-landed via or a hanging via.

9. The integrated circuit of claim 1, wherein the anchoring structure comprises a through-silicon via (TSV).

10. The integrated circuit of claim 1, wherein each of the first and second circuit layers further comprises a dielectric material in which the first filler line and first feature are formed.

11. The integrated circuit of claim 10, wherein the dielectric material comprises a low-κ dielectric material having a dielectric constant that is less than the dielectric constant of silicon dioxide ($SiO_2$).

12. The integrated circuit of claim 1 wherein the integrated circuit is part of a configuration that includes two or more dies bonded together within a common package.

13. A flip-chip package comprising the integrated circuit of claim 1.

14. An integrated circuit comprising:
a first dielectric layer including metal lines running parallel to each other in first direction, the metal lines including a metal filler line;
a second dielectric layer including metal lines running parallel to each other in second direction orthogonal to the first direction, the metal lines including a metal filler line; and
a metal via extending from the metal filler line of the first dielectric layer to the metal filler line of the second dielectric layer;
wherein at least one of the metal filler lines is electrically floating.

15. The integrated circuit of claim 14, wherein at least one of the first and second dielectric layers comprises a low-κ dielectric material having a dielectric constant that is less than the dielectric constant of silicon dioxide (SiO2).

16. The integrated circuit of claim 15, wherein both of the first and second dielectric layers comprise a low-κ dielectric material having a dielectric constant that is less than the dielectric constant of silicon dioxide (SiO2).

17. The integrated circuit of claim 14, wherein the via comprises a conductive barrier layer.

18. The integrated circuit of claim 14 wherein both of the metal filler lines are electrically floating.

19. An integrated circuit comprising:
a first low-κ dielectric material layer including metal lines running parallel to each other in first direction, the metal lines including one or more metal filler lines between non-filler metal lines;
a second low-κ dielectric material layer including metal lines running parallel to each other in second direction orthogonal to the first direction, the metal lines including one or more metal filler lines between non-filler metal lines; and
a metal via extending from the metal filler line of the first low-κ dielectric material layer to the metal filler line of the second low-κ dielectric material layer;
wherein at least one of the metal filler lines is electrically floating and at least one of the non-filler metal lines is electrically connected to one or more electrical components of the integrated circuit.

20. The integrated circuit of claim 19, wherein at least one of the metal filler lines is used for power optimization and provides at least one of a voltage drop and heat-sinking.

* * * * *